United States Patent [19]
Inatome et al.

[11] Patent Number: 6,028,972
[45] Date of Patent: *Feb. 22, 2000

[54] APPARATUS FOR READING OPTICAL DATA FROM A MOTION PICTURE FILM AND A LIGHT SOURCE THEREFOR

[75] Inventors: Kiyoshi Inatome; Etsuro Saito; Katsuichi Tachi, all of Kanagawa, Japan

[73] Assignees: Sony Corporation, Tokyo, Japan; Sony Cinema Products Corporation, Culver City, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/957,710

[22] Filed: Oct. 24, 1997

Related U.S. Application Data

[63] Continuation of application No. 08/386,767, Feb. 9, 1995, Pat. No. 5,761,349.

[30] Foreign Application Priority Data

Feb. 23, 1994 [JP] Japan .................................. 6-025258
Jun. 20, 1994 [JP] Japan .................................. 6-137025

[51] Int. Cl.[7] ........................... G06K 7/00; G03B 31/02; G11B 7/00
[52] U.S. Cl. ............................ 382/312; 352/27; 369/125
[58] Field of Search ................................ 352/27, 26, 37, 352/11; 385/901; 382/312; 362/27, 31; 369/125

[56] References Cited

U.S. PATENT DOCUMENTS

| | | | |
|---|---|---|---|
| 4,461,552 | 7/1984 | Levine | 352/27 |
| 4,993,802 | 2/1991 | Concannon et al. | 385/901 |
| 5,053,929 | 10/1991 | Le Gars | 385/901 |
| 5,309,277 | 5/1994 | Deck | 362/252 |
| 5,327,182 | 7/1994 | Kohut et al. | 352/27 |

*Primary Examiner*—Thomas D. Lee
*Assistant Examiner*—Wenpeng Chen
*Attorney, Agent, or Firm*—Frommer Lawrence & Haug, LLP.; William S. Frommer

[57] ABSTRACT

A motion picture film having digital audio data recorded in at least one sound track thereof. Such digital audio data includes a plurality of bytes of data each having 8 bits of data. Each respective bit of each byte of audio data is recorded in a sound track of the film in the film running direction and each byte is arranged side-by-side in a direction normal to the film running direction to form a compression processing block. C1 parity data is added to each such compression processing block and C2 parity data is added after a predetermined interval of plural compression processing blocks. Error correction may be performed by utilizing the C1 and C2 parity data for each compression processing block and at the predetermined interval of plural compression blocks.

3 Claims, 13 Drawing Sheets

APPARATUS FOR READING OPTICAL DATA FROM A MOTION PICTURE FILM AND A LIGHT SOURCE THEREFOR

This application is a continuation of application Ser. No. 08/386,167, now U.S. Pat. No. 5,761,349 filed on Feb. 9, 1995.

FIELD OF THE INVENTION

The present invention relates to an apparatus for reading optical data from a motion picture film and a light source therefor.

BACKGROUND OF THE INVENTION

Conventional motion picture film may include picture recording regions respectively arranged in a plurality of frames at an approximate mid-portion of the film and two series or rows of film take-up holes (perforations) respectively located on either side of each picture recording region. Such motion picture film may further include a linear analog sound track located between the picture recording regions and one row of the perforations which extends in a film take-up direction. Analog signals may be recorded onto such analog sound track by the use of analog recording techniques.

Due to the recent progress in digital technology, audio information or data associated with a motion picture may be digitally recorded onto a motion picture film. However, the recording position of the picture recording regions and the analog sound track are standardized by the Society Motion Picture and Television Engineers (SMPTE), an association in USA of motion picture and television engineers. As a result, digitized audio information or data is recorded in positions other than the picture recording regions and the analog sound track. More specifically, two digital sound tracks are provided in the film running direction of the motion picture film for recording digitized audio data therein and for reproducing the recorded digitized audio data therefrom. Each of such digital sound tracks is located between the perforations and a respective one of the lateral film edges. The audio data includes audio data for a right channel and audio data for a left channel which are each respectively recorded in a linear manner in one of the two digital sound tracks. Each of such audio data includes synchronization data, audio data and tracking patterns which are recorded in a direction normal to the film running direction in the digital sound tracks. The synchronization data or pattern is formed at the leading end of a block made up of a predetermined number of data followed by the audio data which is recorded block-by-block. The tracking patterns are recorded at each of the recording start and the recording end portions. Such tracking patterns are recorded in stripes on both sides of the digital sound tracks extending along the film running direction.

A reproducing apparatus for reproducing the digitized audio data from the motion picture film may include two CCD line sensors adapted for scanning the digital sound tracks so as to respectively read out the audio data recorded in the channels. Each of the CCD line sensors has a one-line reading region and is arranged so as to read such line in a direction normal to the film running or proceeding direction. Light out of a halogen lamp which is always turned on during reproduction is radiated from the back surface of the motion picture film. As a result, the synchronization data, audio data and the tracking patterns recorded on the digital sound tracks of the motion picture film are illuminated and radiated on the reading regions of each of the CCD line sensors.

The CCD line sensors have a function of so-called electronic shutter and are controlled so as to receive light for a predetermined time period. The CCD line sensors receive the illuminated synchronization data, audio data and the tracking patterns and convert them into electrical signals which are supplied to a data processor included in the reproducing apparatus. The data processor reproduces the audio data on a block basis in synchronization with the synchronization data and routes the reproduced audio data to a digital-to-analog (D/A) converter, which may be included in the reproducing apparatus, so as to convert the audio data to analog audio signals. Such analog audio signals may be thereafter supplied to a speaker unit. As a result, the speech corresponding to the digital audio data is provided by way of the speaker unit.

As previously described, the data processor receives signals corresponding to the tracking patterns from the CCD line sensors. Such signals are utilized by the data processor to provide tracking control data. More specifically, the tracking pattern is recorded at the recording start position and the recording end position for one-line of audio data. The data processor detects a level difference between, for example, the tracking pattern reproduced at the recording start position and that reproduced at the recording end position, so as to determine or detect a tracking error. The readout timing of the CCD line sensor is variably controlled in response to the tracking error. As a result, tracking error may be corrected so as to effect reproduction of the audio data at all times in the so-called just-track condition.

Heretofore, a halogen lamp has been used as a light source for reproducing audio data. However, the halogen lamp suffers from such defects as increased power consumption and heat evolution, such that heat radiating means have to be provided thus leading to an increased size of the apparatus and increased production cost. In addition, the halogen lamp has only a short service life and presents problems in operational reliability and increased labor in maintenance and management.

In addition, it has hitherto been practiced to keep the halogen lamp turned on at all times in order to reproduce audio data, so that it has been necessary to provide the above-mentioned CCD image sensor having the function of an electronic shutter. The function of the electronic shutter is to drain charges accumulated in respective pixels of the CCD image sensor by a drain pulse in order to adjust the charge accumulation time. There is now presented a problem that the charges drained by the drain pulse be fluctuated from pixel to pixel and that such fluctuations appear as an output noise in the CCD image sensor output. If the CCD image sensor output is subjected to such noise, the error rate is deteriorated and an abnormal noise is occasionally produced in the playback sound.

OBJECTS AND SUMMARY OF THE INVENTION

An object of the present invention is to provide an optical data reading apparatus which may be reduced in size and in production cost and which may be improved in operating reliability.

Another object of the present invention is to provide a light source for reading optical data which may be reduced in power consumption and heat evolution and which may be improved in durability.

Another object of the present invention is to provide a light source for reading optical data which may be able to radiate a sufficient quantity of widely spread readout light to an information recording medium.

A still another object of the present invention is to provide a light source for reading optical data which may be able to radiate widely spread readout light with a uniform light quantity to an information recording medium.

In its one aspect, the present invention provides an apparatus for reading optical data from a motion picture film including at least one digital sound track extending along film running direction having a recording area with lines extending in a direction normal to the film running direction and columns extending in the film running direction. The apparatus includes a light emitting diode for emitting the readout light radiated on the motion picture film, light emission controlling means for driving the light emitting diode by pulsed lighting at a pre-set timing in a controlled manner, and a CCD line sensor for receiving the readout light radiated by the light emitting diode to the motion picture film. The CCD line sensor reproduces the readout light to digital data by photo-electric conversion and outputs the reproduced digital data.

In another aspect, the present invention provides a light source of an apparatus for reading optical data from a motion picture film including at least one digital sound track extending along film running direction having a recording area with lines extending in a direction normal to the film running direction and columns extending in the film running direction. The method includes an optical fiber for guiding the readout light incident on plural branched light input sections for radiating the readout light on the motion picture film at a light output thereof, at least one first light emitting diode for radiating the readout light at least one of the light input sections from a direction along the optical axis of the optical fiber, and at least one second light emitting diode for radiating the readout light at least one of the light input sections from an oblique direction intersecting the optical axis of the optical fiber.

Since the light emitting diode is employed in the optical data readout apparatus according to the present invention, high-speed driving for pulsed lighting can be realized in a manner which has not been possible with the halogen lamp. Thus the readout light can be intermittently radiated to the CCD line sensor so that it becomes possible to use a CCD line sensor not having the electronic shutter function. Alternatively, the CCD line sensor having the electronic function may be employed without exploiting the electronic shutter function.

Thus it becomes possible to prevent the quantity of electronic charges to be drained by the drain pulse from being fluctuated from pixel to pixel and such fluctuations be presented as CCD line sensor output noise, while it becomes possible to prevent abnormal noise from being produced in the playback sound and to improve the error rate.

The light emitting diode is small-sized and longer in service life while being low in power consumption or heat evolution. Thus the power consumption or heat evolution may be lower than when the halogen lamp is used as a light source. Consequently, there is no necessity of employing separate heat dissipating means, so that the size of he apparatus and hence its production cost may be diminished. The light emitting diode is longer in service life thus simplifying maintenance and management and improving operating reliability.

In addition, with the optical data readout apparatus according to the present invention, the light emitting diode radiates the red-hued light to the digital sound track. That is, by employing a red-hued light emitting diode as the light emitting diode, the CCD line sensor can positively receive the playback light of the audio data on account of excellent light receiving characteristics for the red-hued light of the CCD line sensor, thereby improving audio data reproducing accuracy.

Furthermore, with the light source for reading optical data according to the present invention, the readout light is radiated to respective light receiving sections of the optical fibers by plural second light emitting diodes from a plurality of oblique directions intersecting the optical axis of the optical fibers, thereby increasing the quantity of spread-out components of the readout light radiated from the light output of the optical fibers onto the information recording medium, thereby diminishing readout errors due to scratches and contamination in the information recording medium.

DETAILED DESCRIPTION OF THE PREFERRED EMBODIMENTS

Figure 1:
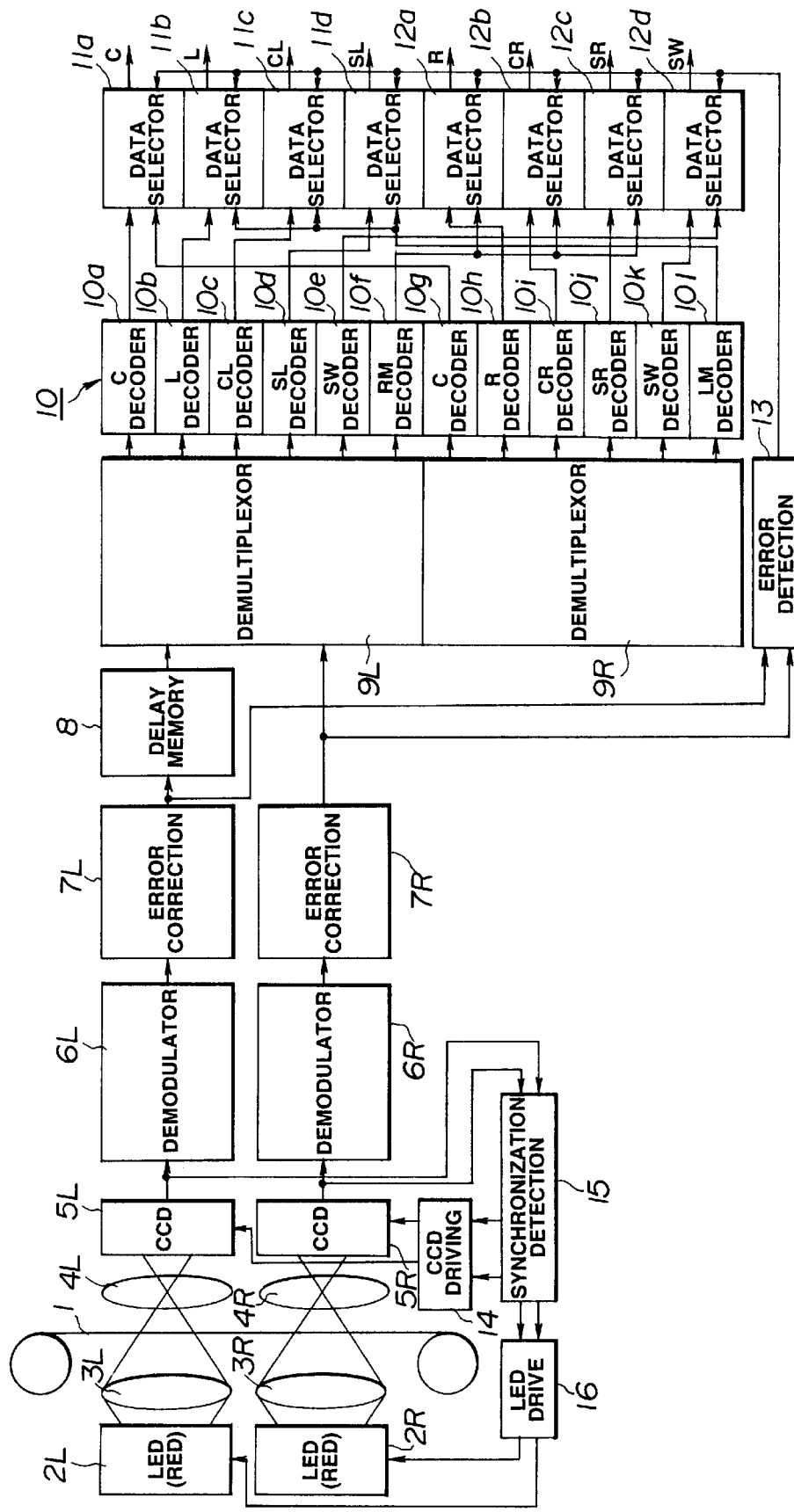
FIG. 1 is a block diagram showing an apparatus for reproducing audio data for a motion picture film according to the present invention.

Referring to the drawings, preferred embodiments of an optical data readout apparatus and a light source for reading optical data according to the present invention will be explained in detail.

The optical data readout apparatus according to the present invention is arranged as shown for example in FIG. 1. In the embodiment shown in FIG. 1, the present invention is applied to an audio data reproducing apparatus for reproducing data of a motion picture film.

The audio data reproducing apparatus for reproducing data of a motion picture film reproduces audio data from a left channel digital sound track and a right channel digital sound track recorded on a motion picture film 1, as shown in FIG. 1. The audio data reproducing apparatus includes a light emitting diode (LED) 2L for radiating light on the left-channel digital sound track and a light emitting diode (LED) 2R for radiating light on the right-channel digital sound track.

As the light emitting diodes 2L and 2R, those emitting red-hued light are used for conformity to light receiving characteristics of the CCD line sensors as later explained.

The audio data reproducing apparatus also includes objective lenses 3L, 3R for radiating the light from the light emitting diodes 2L, 2R to the respective digital sound tracks of the motion picture film 1 and objective lenses 4L, 4R for radiating the playback light generated by the light from the light emitting diodes 2L, 2R being passed through the motion picture film 1 to a first CCD line sensor 5L for the left channel and to a second CCD line sensor 5R for the right channel, respectively.

The audio data reproducing apparatus further includes a synchronization detection circuit 15 for detecting synchronization data recorded at a leading end of a film block as one recording unit for audio data, a CCD driving circuit 14 for driving the CCD line sensors 5L, 5R based upon the detection output of the synchronization detection circuit 15 and a LED driving circuit 16 for driving the light emitting diodes 2L, 2R at pre-set timing for a predetermined time period for pulsed lighting based upon a detection output of the synchronization detection circuit 15.

As the CCD line sensors 5L, 5R, those not having the so-called electronic shutter are employed. The charge accumulation time is controlled by the light emitting time of the light emitting diodes 2L, 2R by the turn-on (lighting) control of the LED driving circuit 16.

Such reproducing apparatus includes first and second CCD line sensors 5L and 5R, demodulators 6L and 6R, error correction devices 7L and 7R, a delay memory 8, an error detector 13, demultiplexors 9L and 9R, a plurality of decoders 10a–10l, and a plurality of data selectors 11a–11d and 12a–12d which are connected as shown in FIG. 1. Left route audio data may be read by the first CCD line sensor 5L and supplied to the demodulator 6L so as to be demodulated. Similarly, the right route audio data may be read by the second CCD line sensor 5R and supplied to the demodulator 6R so as to be demodulated. Outputs from the demodulators 6L and 6R are respectively supplied to the error correction devices 7L and 7R whereupon error-correction on the left-route audio data and right-route audio data are performed. An error corrected output signal from the error correction device 7L is supplied to the error detector 13 and to the delay memory 8L which is adapted to delay such signal by a predetermined amount and to supply an output therefrom to the demultiplexor 9L. An error corrected output signal from the error correction device 7R is supplied to the error detector 13 and to the demultiplexor 9R. The error flag detector 13 is adapted to detect an error flag which may be generated by the error correction devices 7L and/or 7R if the error correcting circuits could not perform error correction. The demultiplexor 9L is adapted to receive a series signal from the delay memory 8 and to generate therefrom the left-route audio data in parallel. Similarly, the demultiplexor 9R receives a series signal from the error correction device 7R and generates therefrom the right-route audio data in parallel. Parallel output signals from the demultiplexors 9L and 9R are respectively supplied to the decoders 10a–10f and 10g–10l, whereupon the left and right route audio data is decoded. Output signals from the decoders 11a–11l are supplied to the data selectors 11a–11d and 12a–12d which also receive a detection output signal from the error detector 13. The data selectors 11a–11d are adapted to select and output therefrom left-route audio data based on the detection output of the error detection circuit 13. Similarly, the data selectors 12a–12d select and output right-route audio data based on the detection output of the error detection circuit 13.

Figure 2:
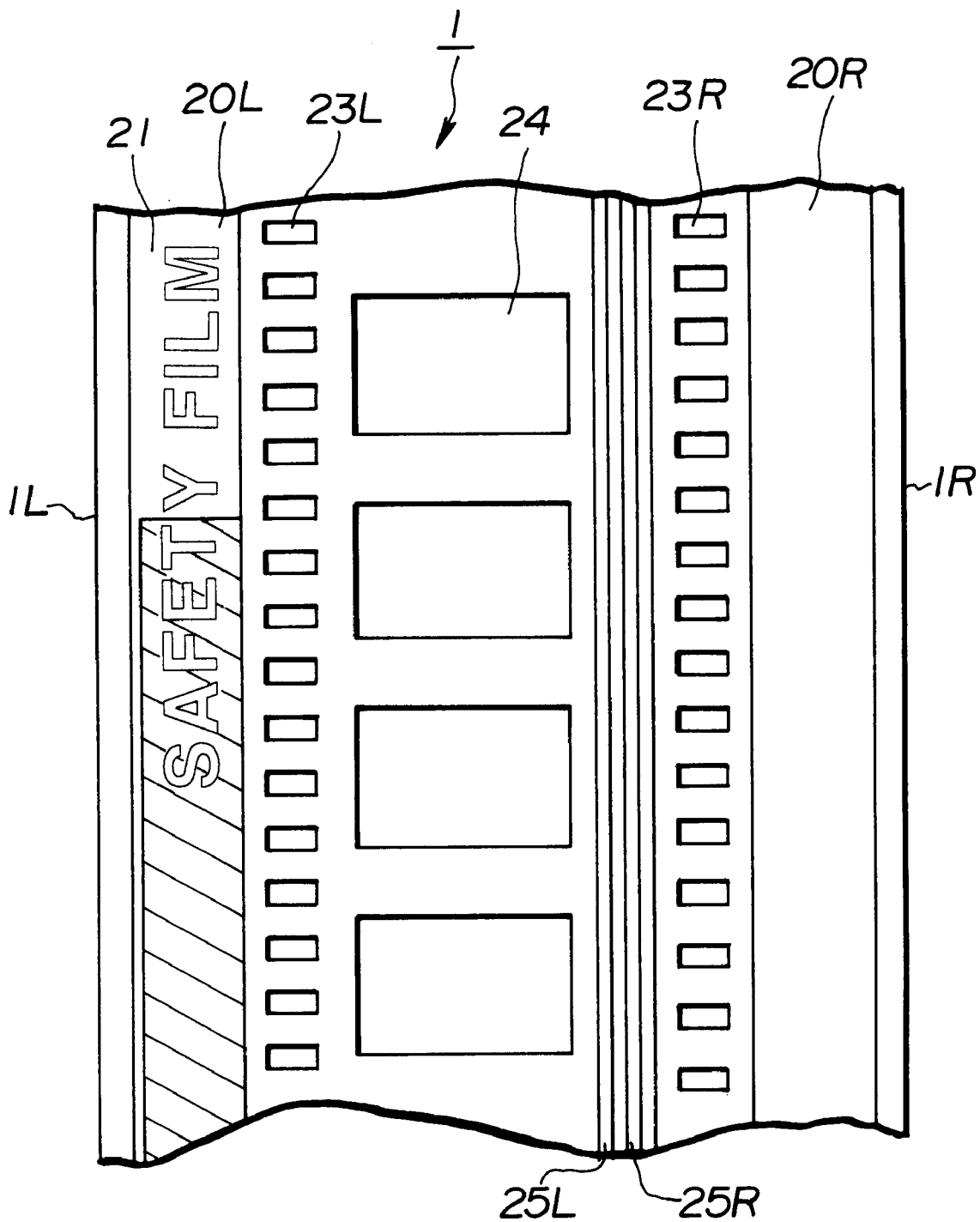
FIG. 2 is a partial plan view of the motion picture film for illustrating a digital sound track and letters for identification recorded on the motion picture film.

FIG. 2 illustrate s a motion picture film 1 in accordance with an embodiment of the present invention. As shown therein, such motion picture film includes a picture recording area 24 for recording a picture or image to be projected, perforation areas 23L and 23R for transporting the motion picture film during a projection operation, analog sound tracks 25L, 25R for recording analog audio signals which may be reproduced therefrom with conventional equipment, and digital sound tracks 20L and 20R for recording multi-channel digital audio data.

Left and right channels of analog audio data or signals are respectively recorded in the analog sound tracks 25L and 25R.

Left and right channels of digitized audio signals are respectively recorded in a predetermined manner in the digital sound tracks 20L and 20R. More specifically, a center channel (C), a left channel (L), a center left channel (CL), a surround left channel (SL), a sub-woofer channel (SW) and a right mix channel (RM), are recorded in this order in the digital sound track 20L. The right mix channel (RM) may be formed from a right channel (R), a center right channel (CR) and a surround right channel (SR). That is, C, L, CL, SW and RM channels of data are recorded as a left-channel or route of audio data in the digital sound track 20L. Further, a center channel (C), a right channel (R), a center right channel (CR), a surround right channel (SR), a sub-woofer channel (SW) and a left mix channel (LM) are recorded in this order in the digital sound track 20R. The left mix channel (LM) may be formed from a left channel (L), a center left channel (CL) and a surround left channel (SL). That is, C, R, CR, SR, SW and LM are recorded as a right-channel or route of audio data in the digital sound track 20R.

On the digital sound track 20L or on the digital sound track 20R, there are recorded letters such as "SAFETY FILM". with a line thickness of 150 to 200 μm, as shown for example in FIG. 2, as the visibly recognizable identification information (ID code).

Such ID code may include the name of the film manufacturer, name of the developer, recording data or the title of the motion picture film. Since these can be recognized visibly, the name of the film manufacturer, for example, may be recognized easily.

The left route audio data for C, L, CL, SL, SW and RM and the right route audio data for C, R, CR, SR, SW and LM, respectively recorded on the digital sound tracks 20L, 20R, are processed with high efficiency encoding consisting in the combination of sub-band coding, orthogonal transform encoding or bit allocation, whereby the data volume is compressed to about one-fifth as large as the original data volume. For each film block, which is one recording unit, the C2 parity and C1 parity error correction codes, employing the cross-interleave Reed Solomon code, are appended along with leading end data comprised of synchronization data, tracking patterns and identification information. At the same width-wise position of the film, the right and left channels are physically shifted in their recording positions by e.g., 17.8 frames from each other.

Figure 3:
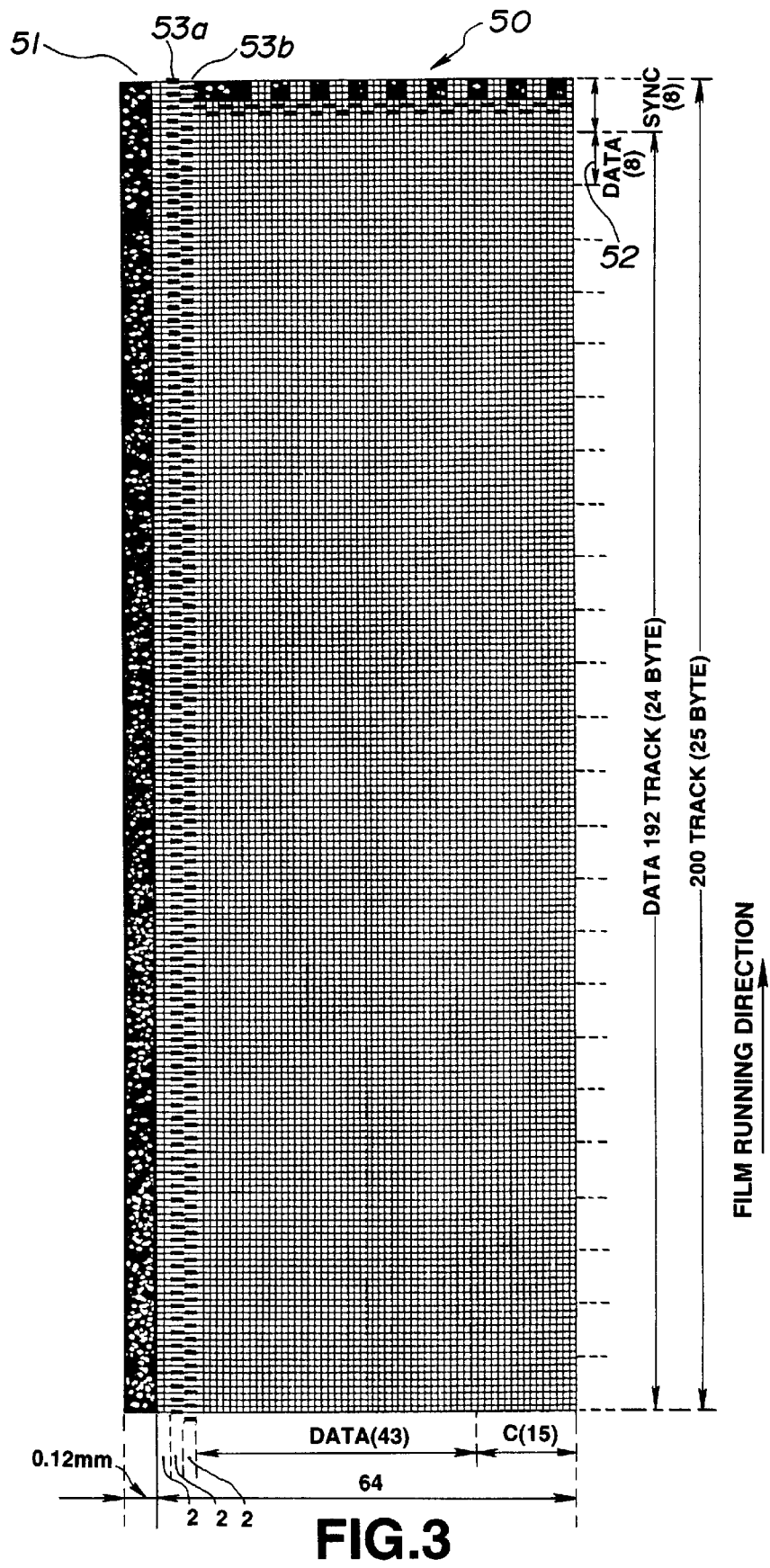
FIG. 3 illustrates the manner in which film blocks formed by the interleaving technique may be recorded on the motion picture film of FIG. 1.

More specifically, audio data are recorded on the digital audio sound tracks 20L, 20R on the basis of film blocks as recording units, a shown in FIG. 3.

The film blocks are formed by the above-described interleaving, and the right and left channel digital sound tracks are recorded on a channel-by-channel basis. More specifically, audio data may be recorded in each film block in the digital sound tracks as shown in FIG. 3. That is, recorded in such film blocks are the leading end data 50, light-barrier regions 51 which extend on one side of the digital sound tracks in the film running direction and which may have a width of approximately of 0.12 mm, the audio data, C1 parity and C2 parity which extend in a direction normal to the film running direction and in a side-by-side relation to the film running direction, and stripe-shaped tracking patterns 53a and 53b which extend in the film running direction and which are located adjacent to the light barrier regions 51, as shown in FIG. 3. The tracking patterns 53a and 53b may be a white/black repeat pattern having a predetermined repeat interval, such as an interval of one dot, in the film running direction. Such tracking patterns 53a and 53b may be recorded with a one dot offset in the film running direction as shown in FIG. 3. Further, 1-byte (8 bits) of data 52 extends in a film running direction. In other words, 1-byte of audio data of any channel is aligned along the film running direction. Such arrangement improves the quality of the audio reproduction. That is, the ability for performing error correction does not change when a 1 bit error or 8 bits of error occur in a 1-byte of data in an error correction system utilizing a predetermined coding technique, such as Reed-Solomon coding or the like, in which error correction may be performed with a 1-byte (8 bits) unit. Such arrangement may be disadvantageous if the 1-byte allocation is aligned or arranged in a direction normal to the scratches. However, as previously described, longitudinal scratches typically occur more frequently than transverse scratches on motion picture film as the film is repeatedly reproduced. Therefore, by arranging the data in a one byte arrangement in-line with the film running direction as previously described, the present invention may relatively easily correct or compensate for errors caused by the more frequently occurring type of scratches, that is, longitudinal scratches.

Figure 4:
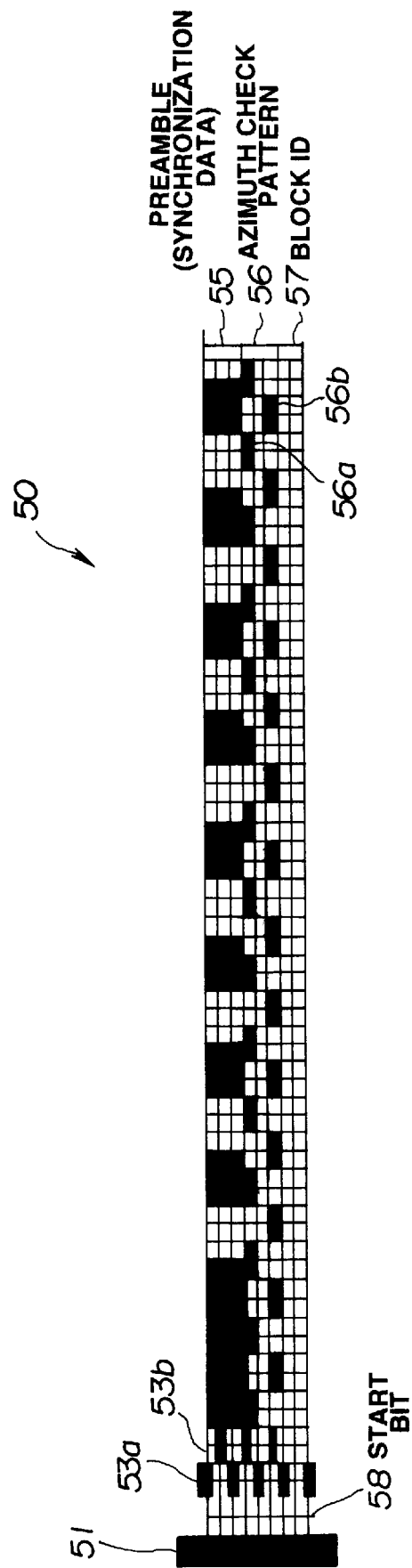
FIG. 4 illustrates the leading end data recorded on the motion picture film.

FIG. 4 illustrates a pattern of the leading end data 50. As shown therein, the preamble 55 is recorded as three dots in the film running direction. A black and white repeat pattern extends at right angles to the film running direction. The azimuth check pattern 56 includes a 2-dot white/black repeat pattern 56a recorded in a direction normal to the film running direction and a 2-dot white/black repeat pattern 56b recorded with an offset of 2 dots in a direction normal to the film running direction with respect to the repeat pattern 56a. Thereafter, the block ID57 is recorded.

Figure 9:
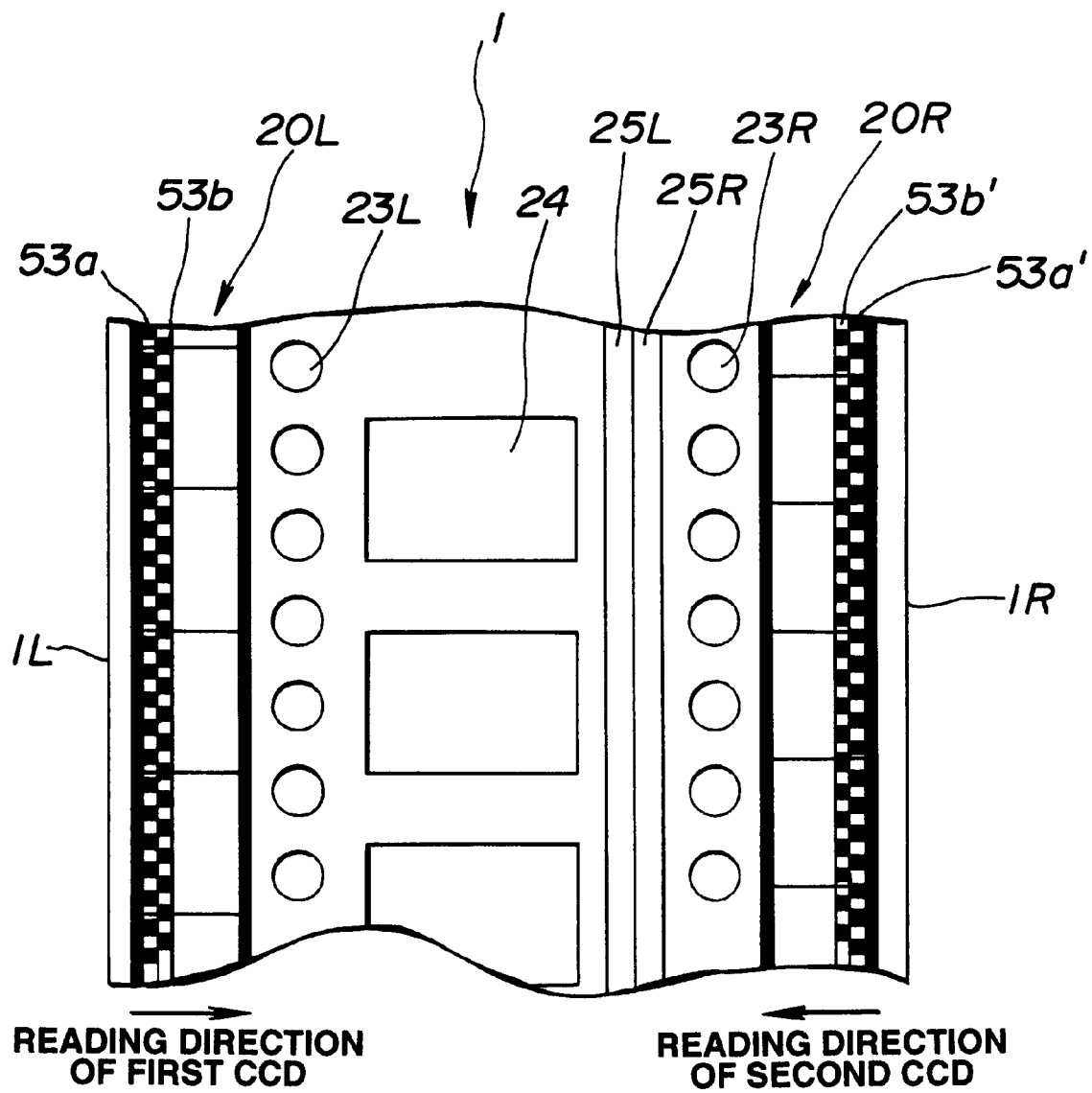
FIG. 9 illustrates film blocks symmetrically recorded on the right-channel sound track and the left-channel digital sound track of the motion picture film.

The above-described film block may be symmetrically recorded in the right channel digital sound track 5R and the left channel digital sound track 5L of the motion picture film of the present invention. As shown in FIG. 9, the tracking patterns 53a and 53b of the left channel digital sound track 5L are recorded adjacent to the left edge 1L of the film 1, while the tracking patterns 53a' and 53b' of the right channel digital sound track 5R are recorded adjacent to the right edge 1R of the film 1. During reproduction, the left channel digital sound track 5L is read from the left edge 1L of the film 1, while the right channel digital sound track 5R is read from the right edge 1R of the film 1.

Figure 5:
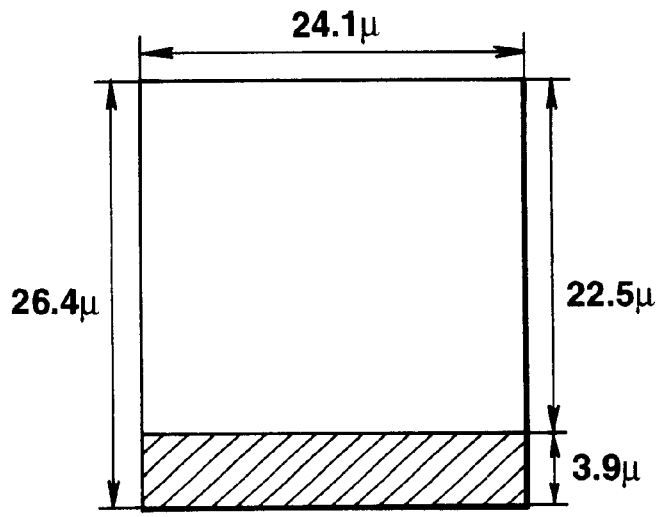
FIG. 5 is a diagram illustrating the size of an audio data dot recorded on the motion picture film.
Figure 6:
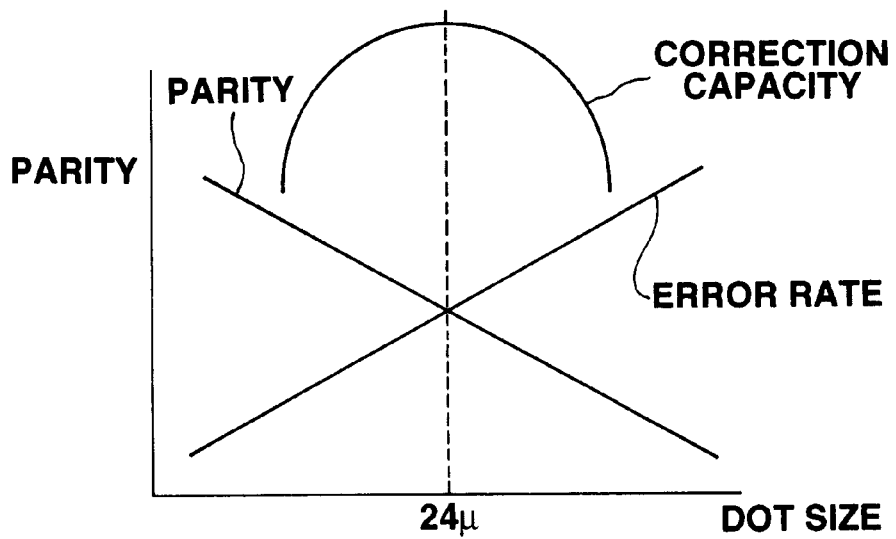
FIG. 6 is a graph to which reference will be made in explaining the relationship between the dot size and error correction capability.

The audio data recorded on the motion picture film 1 has a predetermined size. More specifically, an audio data dot may have a size of 26.4$\mu$×24.1$\mu$to as, for example, shown in FIG. 5. The relationship between the dot size and the parity may be as shown in FIG. 6, wherein it is observed that as the dot size increases, the error rate becomes improved, and when the dot size is reduced, more parity data is appended or added. As further shown in FIG. 6, the error correction capability may be represented by a quadratic curve with the transverse dot size of 24.1$\mu$ as an apex. As a result, since the present invention records audio data dots having a size of 26.4$\mu$×24.1$\mu$, which size corresponds to the maximum error correcting capability, accurate reproduction of the audio data is facilitated.

The ID codes indicating the names of the film manufacturers or developers, recorded for visual recognition, are recorded in red hues, while the audio data are recorded in blue dots.

The operation of the reproducing apparatus for reproducing audio data for a motion picture film 1, is now explained.

On initiation of reproduction, the light emitting diodes 2L, 2R are driven for pulse lighting by a LED driving circuit 16, in a manner as explained subsequently. This causes the red-hued light to be radiated on the digital sound tracks 20R, 20L on the motion picture film 1. The red-hued light is radiated on the CCD line sensors 5L, 5R via the digital sound tracks 20R, 20L as the reproducing light indicating audio data of the respective channels.

Upon initiating reproduction, the CCD line sensor 5L and the CCD line sensor 5R read the audio data recorded on the digital sound tracks 20R and 20L. More specifically, the CCD line sensor 20L reads out the left route audio data line by line towards the picture region 24 from the left edge 1L in a direction normal or at right angles to the film running direction (see FIG. 9) and supplies the read data to the demodulator 9L. Similarly, the CCD line sensor 5R reads out the right route audio data line by line towards the picture region 24 from the right edge 1R in a direction at right angles to the film running direction (see FIG. 9) and supplies the read data to the demodulator 6R.

As previously described, tracking patterns or like data are recorded in each of the digital sound tracks 20L, 20R and the CCD line sensors 5L and 5R respectively read out data from the film edges 1L and IR. As a result, data such as the tracking patterns may be read without being obstructed by the perforations 23L and 23R in order to assure correct data reproduction.

As is to be appreciated, if tracking patterns are recorded on both sides of each data track, tracking error correction capability may be increased. However, in such situation, the audio data recording region is reduced since the tracking patterns are provided on both sides of the data tracks. Accordingly, the tracking patterns 53a and 53b are preferably provided only at one side of the digital sound tracks 5L and 5R so that a relatively wider audio data recording region may be obtained thereby increasing the amount of audio data which may be recorded as compared to the situation in which tracking patterns are recorded on both sides.

The demodulators 6L and 6R respectively demodulate the left and right route audio data and supply the demodulated data to the error correction circuits 7L and 7R. The error correction circuit 7L performs error correction on the left route audio data by utilizing the C1 parity and C2 parity. The error correction circuit 7L forms an error flag if such error correction cannot be performed and provides such error flag to the error correction circuit 13. The error correction circuit 7L provides error-corrected data to the delay memory 8. Similarly, the error correction circuit 7R performs error correction on the right route audio data using the C1 parity and C2 parity and provides the error-corrected data to the demultiplexor 9R while forming an error flag if such correction cannot be performed and provides the error flag to the error correction circuit 13.

As previously described, scratches, such as longitudinal scratches extending in the film running direction and transverse scratches extending at right angles to the film running direction, may be generated on the motion picture film 1. Longitudinal scratches tend to be produced more frequently than the transverse scratches as the film 1 is used repeatedly. As a result, if the audio data is recorded in a direction at right angles to the film running direction on the digital sound tracks of the motion picture film, audio data may be destroyed for several lines by the longitudinal scratches. However, since each audio data of the present invention is recorded at an interval of a predetermined amount such as 1 byte along the film running direction, as described above, and the byte-based audio data is recorded side-by-side in a direction at right angles to the film ruining direction, longitudinal scratch may destroy only a minimum quantity of audio data, such as one byte. Accordingly, longitudinal scratches, which occur more frequently with the repeated use of the film 1, can be coped with successfully. Further, error correction in a direction at right angles to the film running direction and error correction for the longitudinal scratches can be performed by utilizing the C1 parity. Furthermore, error corrections utilizing the C2 parity may be performed for correcting errors caused by transverse scratches or hardly read out data when defocusing. As a result, the audio data from the motion picture film 1 may be properly reproduced therefrom by use of the present motion picture reproducing apparatus.

The audio data recorded on the motion picture film 1 has a predetermined size. More specifically, an audio data dot may have a size of $26.4\mu \times 24.1\mu$ as, for example, shown in FIG. 5. The relationship between the dot size and the parity may be as shown in FIG. 6, wherein it is observed that as the dot size increases, the error rate becomes improved, and when the dot size is reduced, more parity data is appended or added. As further shown in FIG. 5, the error correction capability may be represented by a quadratic curve with the transverse dot size of $24.1\mu$ as an apex. As a result, since the present invention records audio data dots having a size of $26.4\mu \times 24.1\mu$, which size corresponds to the maximum error correcting capability, accurate reproduction of the audio data is facilitated.

The left-route and right-route audio data recorded on the motion picture film 1 are recorded with a shift of 17.8 frames, as previously described. Accordingly, the delay memory 8 delays the left-route audio data by a time period corresponding to 17.8 frames so as to match the timing thereof with the right route audio data. The resulting delayed data is serially supplied to the demultiplexor 9L which forms therefrom the center channel audio data C, left channel audio data L, center left channel audio data CL, left surround audio data SL, sub-woofer audio data SW and right mix channel audio data RM, and supplies the resulting data to the decoders 10a to 10f.

The demultiplexor 9R serially receives the right route audio data from the error correction device 7R which forms therefrom the center channel audio data C, right channel audio data R, center right channel audio data CR, right surround audio data SR, sub-woofer audio data SW and left mix channel audio data LM, and supplies the resulting data to the decoders log to 101.

The decoders 10a to 10d decode the left route audio data C, L, CL and SL with high efficiency decoding and respectively supply the resulting decoded data to the left route data selectors 11a to 11d. The decoder 11e decodes the left route audio data SW with high efficiency decoding and supplies the resulting data to the right route data selector 12d. The decoder 10f decodes the left route audio data RM with high efficiency decoding and supplies the resulting data to the right route data selectors 12a to 12c. The decoder 10g decodes the right route audio data C with high efficiency decoding and provides the resulting data to the right route data selector 12a. The decoders 10h to 10k respectively decode the right route audio data R, CR, SR and SW with high efficiency decoding and supply the resulting decoded data to the right route data selectors 12a to 12d. The decoder 101 decodes the right route audio data RM with high efficiency decoding and supplies the resulting data to the data selectors 11b to 11d.

The data selectors 11a–11d and 12a–12d further receive the detection output of the error detection circuit 13. Based upon such detection output, the data selectors 11a–11d and 12a–12d may detect or determine the data which had not been error corrected. The data selectors 11a–11d and 12a–12d are each supplied with two audio data as previously described and are adapted to selectively output data other than the data which had not been error corrected.

In other words, the data selector 11a selectively outputs the center channel audio data of the left or right routes which had been error corrected. The data selector 11b selectively outputs the left channel audio data or the left mix channel audio signals which had been error corrected. The data selector 11c selectively outputs the left center channel audio data or the left mix channel audio data which had been error corrected. The data selector 11d selectively outputs the left surround audio data or the left mix channel audio data which had been error corrected. The data selector 12a selectively outputs the right channel audio data or the right mix channel audio data which had been error corrected. The data selector 12b selectively outputs the center right channel audio data or the right mix channel audio signals which had been error corrected. The data selector 12c selectively outputs the right surround audio data or the right mix channel audio data which had been error corrected. The data selector 12d selectively outputs the sub-woofer channel audio data which had been error corrected.

If both of the data signals supplied to any of the data selectors 11a–11d and 12a–12d are valid (for example, both such signals had been error corrected), the respective data selector selects a desired one of the data signals based on predetermined arrangement and supplies such selected signal therefrom. If, however, neither of the data signals supplied to any of the data selectors is valid, the respective data selector(s) does not supply an output data signal therefrom.

The right mix channel audio data RMn, which is produced or mixed from the right channel R, center right channel CR and the surround right channel SR, is recorded on the left channel digital sound track 20 along with the left route audio data SLn, Ln and CLn. The left mix channel audio data LMn, which is produced or mixed from the left channel L, center left channel CL and the surround left channel SL, is recorded on the left channel digital sound track 20L along with the right route audio data SRn, Rn and CRn. The audio data of the respective channels of the digital sound track 20R are recorded thereon with a time difference as compared to the audio data of the respective channels recorded on the digital sound track 20L. As a result, even if a relatively long error burst is produced in one of the digital sound tracks, such as 20L, and there is an error on the opposite side digital sound track 20R, left channel audio data, that is, mixed audio data LMn mixed from the audio data L, CLn and SLn, may be reproduced whereupon left route signals may be generated therefrom.

Figure 11A:
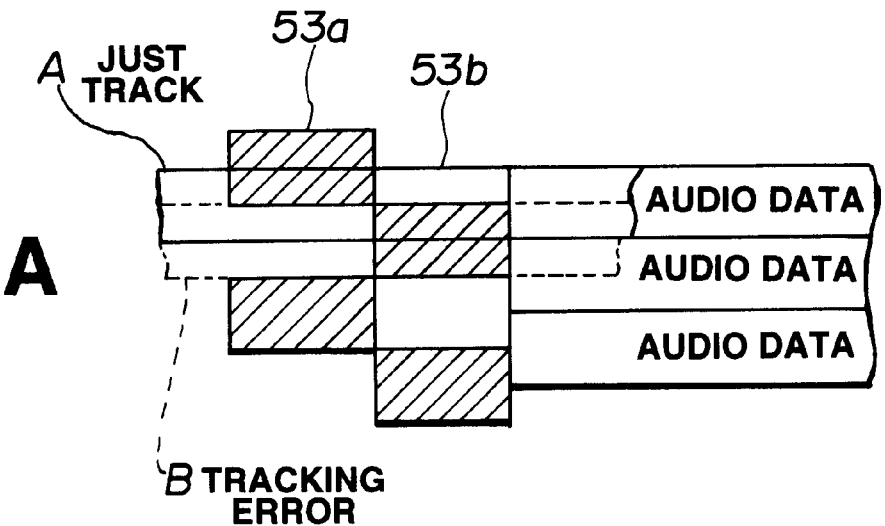
FIGS. 11A to 11B are diagrams to which reference will be made in explaining tracking error of CCD line sensor(s) in reproducing audio data from the motion picture film.
Figure 11B:
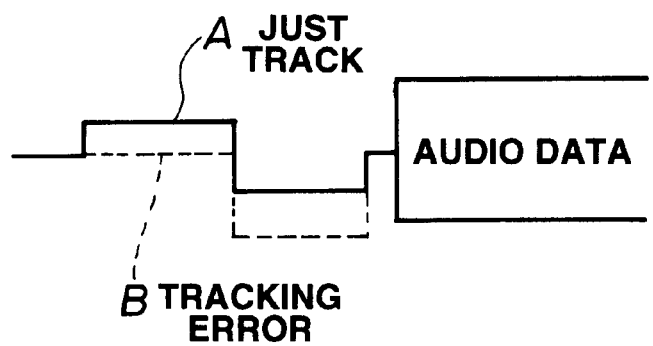

The audio data may be read out on-track by the CCD line sensors 5L or 5R as shown by a solid line A in FIG. 11A. Since the track patterns 53a and 53b are recorded at 90 degree phase positions relative to the audio data along the film running direction, the CCD line sensor, such as CCD line sensor 5L, reproduces only an upper half or a lower half of each of the tracking patterns 53a and 53b. Thus, the reproduced signals of the tracking patterns 53a and 53b correspond to the upper or lower half thereof, as indicated by the solid line A in FIG. 11B. Conversely, if the audio data is read off-track as shown by broken line B in FIG. 11A, the tracking pattern 53b is reproduced substantially entirely. Thus, the reproduced signals of the tracking patterns 53a and 53b are shifted vertically as indicated by a broken line B in FIG. 11B, while reaching a signal level approximately twice the on-track level.

The above-described characteristics are utilized by the present motion picture film reproducing apparatus for correcting the readout timing of the CCD line sensors 5L and 5R so as to correct the tracking error.

Figure 10:
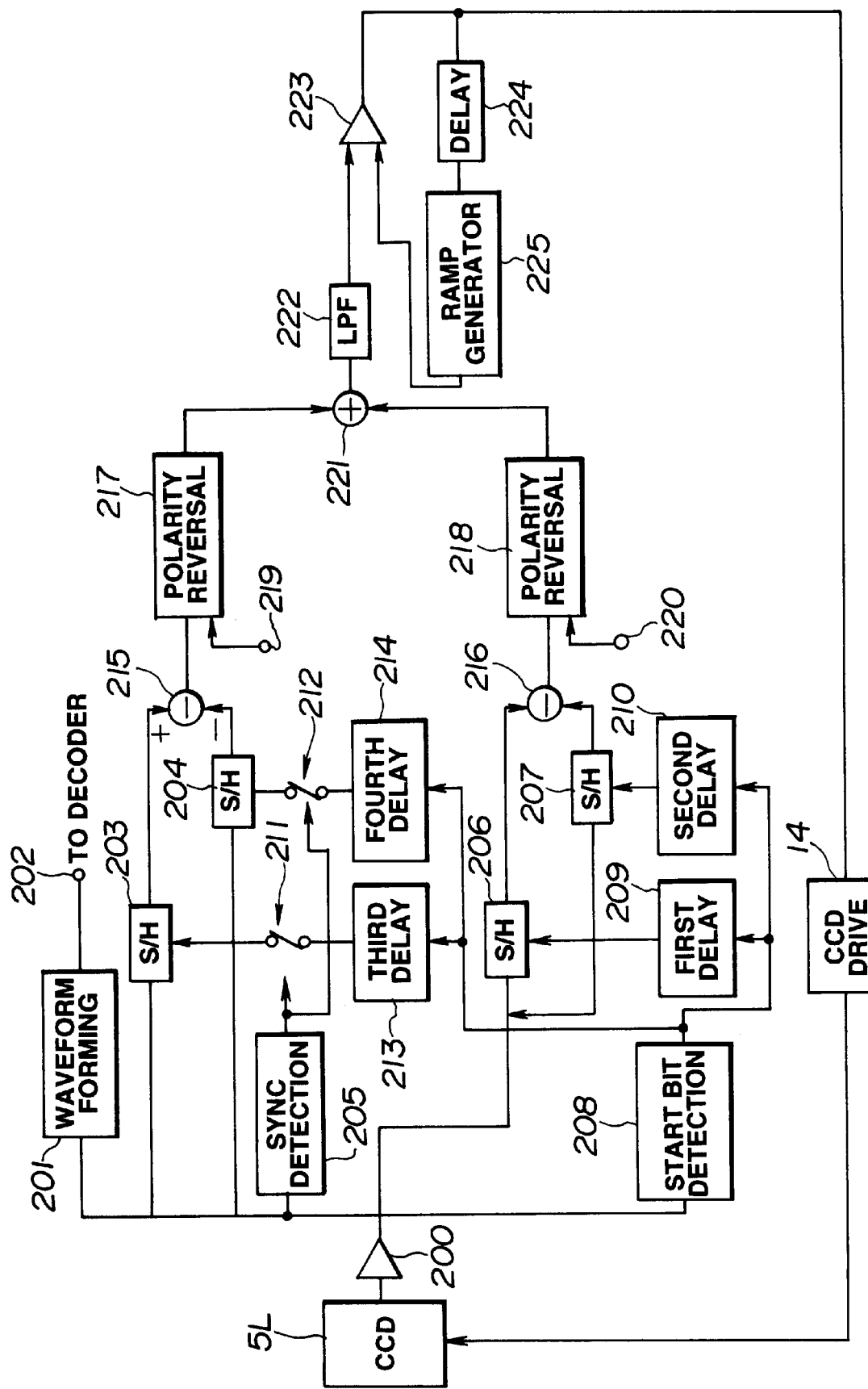
FIG. 10 is a block diagram of a tracking error system of the reproducing apparatus for controlling the readout timing of the CCD line sensor for correcting the tracking error associated with the left channel.

A tracking error correction system for the present motion picture film reproducing apparatus is illustrated in FIG. 10. More specifically, FIG. 10 illustrates the left-route tracking error correction system. However, the right-route channel tracking error correction system may be configured in a substantially similar manner. Consequently, only a description of the operation of the left-route tracking error correction system will be presented below, although, as is to be appreciated, the operation of the right-route tracking error correction system is substantially similar.

Figure 12:
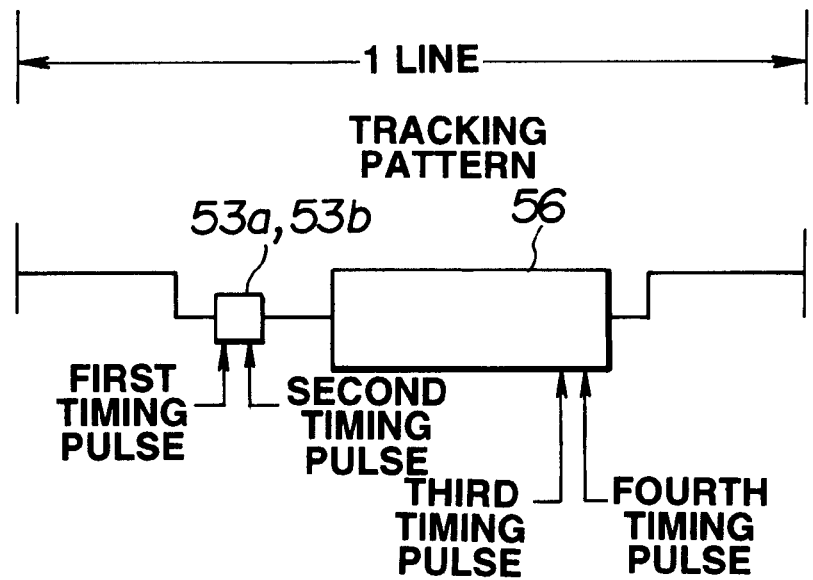
FIG. 12 is a diagram to which reference will be made in explaining the timing of sample-holding the tracking pattern and azimuth check pattern by the tracking error system of FIG. 27.

As shown in FIG. 10, the tracking patterns 53a and 53b and the audio data and so forth read out by the CCD line sensor 5L are supplied by way of an amplifier circuit 200 to a waveforming circuit 201, sample-and-hold circuits 203, 204, 206, 207, a synchronization detection circuit 205 and a start bit detection circuit 208. The waveform shaping circuit 201 waveform-shapes the respective data so as to generate a shaped rectangular wave which is supplied by way of an output terminal 202 to the demodulator 6L (FIG. 1) wherein demodulation and subsequent playback operations are performed. On the other hand, the start bit detection circuit 208 detects a start bit 58 (FIG. 4) recorded in a region between the light-barrier or light-intercepting area 51 and the tracking pattern 53a and routes the detection output to delay circuits 209, 210, 213 and 214, as shown in FIG. 10. Such detection output of the start bit is delayed by the first delay circuit 209, for sample-holding of the tracking pattern 53a, and a delayed output is supplied as a first timing pulse to the sample-and-hold circuit 206, as shown in FIG. 10. The detection output of the start bit is delayed by the second delay circuit 210, for sample-holding the tracking pattern 53b, and a delayed output is supplied as a second timing pulse to the sample-and-hold circuit 207, as shown in FIG. 10. The detection output of the start bit is delayed by the third delay circuit 213, for sample-holding the signal level of data recorded at two dots prior to the last dot of the azimuth check pattern 56, and a delayed output is supplied as a third timing pulse to a switch 211, as shown in FIG. 10. The detection output of the start bit is delayed by the fourth delay circuit 214, for sample-holding the last dot of the azimuth check pattern 56, and a delayed output is supplied as a fourth timing pulse to the switch 212, as shown in FIG. 10. Such first, second, third and fourth timing pulses are illustrated in FIG. 12.

The synchronization detection circuit 205 receives the data reproduced by the CCD line sensor 5L and detects therefrom the synchronization data (preamble) 55 shown in FIG. 4. The synchronization detection circuit 205 forms a relatively high-level data only during the playback time of the azimuth check pattern and supplies the data to switches 211 and 212.

The switches 211 and 212 are controlled so as to be turned on when supplied with the high-level data from the synchronization detection circuit 205. As a result, the switches respectively supply the third and fourth timing pulses from the third and fourth delay circuits 213 and 214 to the sample-and-hold circuits 203 and 204.

The sample-and-hold circuit 206 is adapted to sample-hold the tracking pattern 53a by the first timing pulse from the first delay circuit 209 and to supply the tracking pattern to one input of a subtractor 216. The sample-and-hold circuit 207 is adapted to sample-hold the tracking pattern 53b by the second timing pulse from the second delay circuit 210 and to supply the tracking pattern 53b to the other input of the subtractor 216. The sample-and-hold circuit 203 is adapted to sample-hold the signal level of the data recorded at two dots prior to the last dot of the tilt detection pattern 56 by the third timing pulse from the third delay circuit 213 and to supply the data to one input of a subtractor 215. The sample-and-hold circuit 204 is adapted to sample-hold the data of the last dot of the tilt detection pattern 56 by the fourth timing pulse from the fourth delay circuit 214 and to supply the data to the other input of the subtractor 215.

The subtractor 216 is adapted to obtain a difference between the two signals supplied thereto. In other words, the subtractor 216 detects the difference between the sample-held data of the tracking pattern 53a from the sample-and-hold circuit 206 and the sample-held data of the tracking pattern 53b from the sample-and-hold circuit 207. Such detected difference is supplied to a polarity invertor 218. Similarly, the subtractor 215 is adapted to obtain a difference between the two signals supplied thereto. In other words, the subtractor 215 detects the difference between the sample-held data of the two dots prior to the last dot of the tilt detection pattern 56 from the sample-and-hold circuit 203 and the sample-held data of the last dot of the tilt detection pattern 56 from the sample-and-hold circuit 204. Such detected difference is supplied to a polarity invertor 217.

The polarity invertors 217 and 218 are respectively supplied with polarity inverting data by way of input terminals 219 and 220, along with the detected difference signals from the subtractors 215 and 216. Each of the polarity invertors 217 and 218 is adapted to invert the detected difference signals line-by-line in response to the polarity inverting data and to supply an inverted detection output to an additive node 211. The additive node 221 sums the inverted detection outputs from the polarity invertors 217 and 218. The resulting sum data represents an error of the readout timing of the CCD line sensors 5L formed on the basis of the tracking patterns 53a and 53b and the tilt detection pattern 56. Such sum data is supplied by way of a low-pass filter 222 to one input of a comparator 223.

Figure 13:
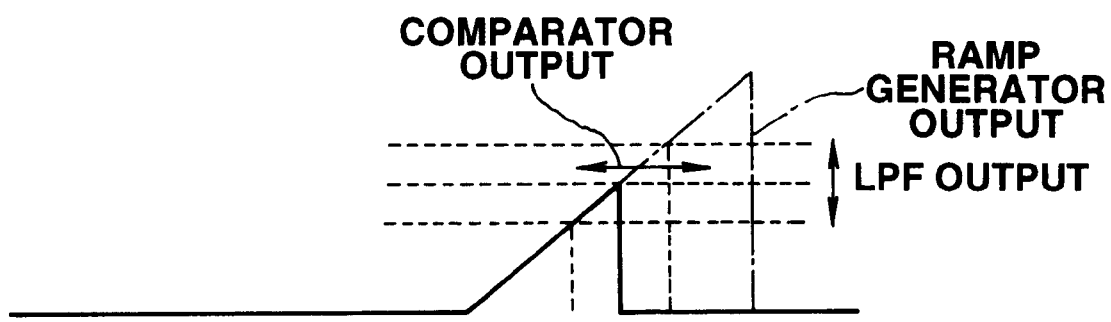
FIG. 13 is a graph illustrating a driving pulse of the CCD line sensor formed by the tracking error correction system.

An output of the comparator 223 is supplied by way of a delay device 224 to a ramp generator 225 which, in turn, supplies a serrated wave having a level indicated by a chain-dotted line in FIG. 13 to the other input of the comparator 223. As a result, the output of the ramp generator 225 is variably controlled in response to the output of the low-pass filter 222, which is to the readout timing error of the CCD line sensor 20L. Thus, the comparator 223 outputs a serrated wave corresponding to a readout timing error of the CCD line sensor 20L, as shown by a broken line and a solid line in FIG. 13. This serrated wave is supplied to the delay circuit 224 and a CCD driving circuit 14. The CCD driving circuit 14 is adapted to control the readout timing of the CCD line sensor 5L in response to the serrated wave indicating the readout timing error.

Thus, the respective data may be read out while tracking correction is executed so that the readout timing of the CCD line sensor 5L is substantially in the just-tracking state at all times.

In the motion picture film 1 of the present invention, the tracking patterns 53a and 53b are recorded on only one of the sides of the digital sound tracks 20L and 20R so as to increase the data area, as previously described. However, if the tracking error is recorded on only one of the sides of the digital sound tracks 20L and 20R, tracking error correction capability may be lowered. However, since the azimuth check pattern 56 is recorded on a film block basis and the tracking error is corrected based upon each detection output of the tracking patterns 53a and 53b and the tilt detection pattern 56, recording the tracking patterns 53a and 53b on only one of the sides as described above does not lower the tracking error correction capability and increases the recording area for the audio data.

The audio data are recorded line-by-line in a direction at right angles to the film proceeding direction, with the line-by-line repetition frequency being e.g., 20 kHz. The one-line audio data is adapted to pass before the CCD line sensors 5L, 5R over e.g., 50 μsec.

The CCD line sensors 5L, 5R cannot correctly read out data at the boundary between data lines. On the other hand, the film dot image becomes blurred at the boundary region due to limitations in the resolution of the film itself and limitations in the objective lenses 3L, 3R, 4L and 4R. Thus the CCD line sensors 5L, 5R can correctly read out data only at a mid-portion of the dot image.

Consequently, the synchronization detection circuit 15 detects synchronization data 55 shown e.g., in FIG. 4 from the playback output of the CCD line sensors 5L, 5R and routes the detected output to the LED driving circuit 16 and to the CCD driving circuit 14.

Figures 8A, 8B, 8C:
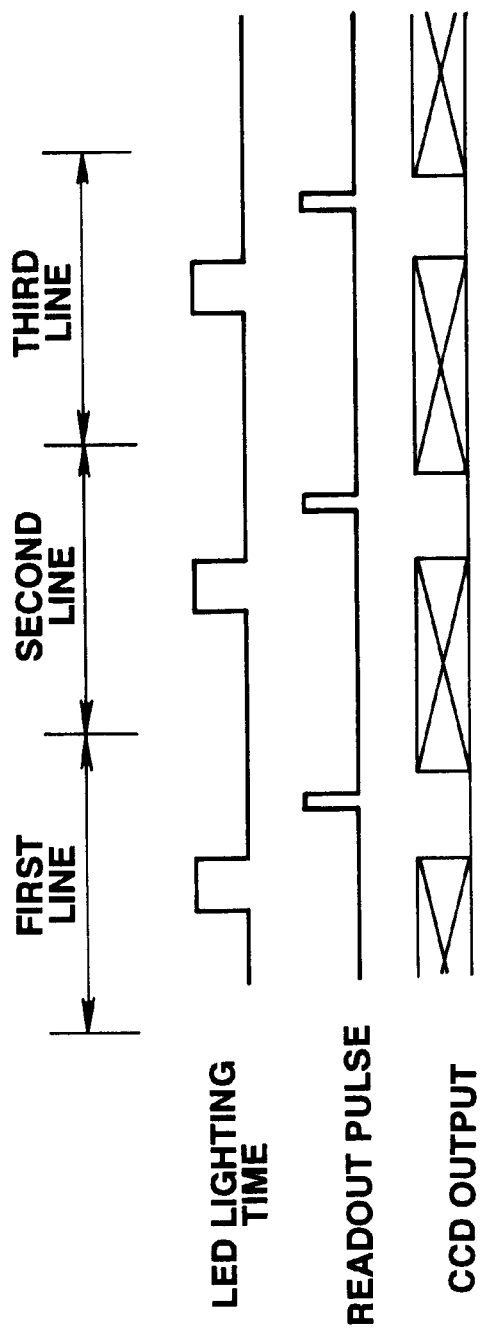
FIGS. 8A to 8C are timing charts for illustrating the turn-on timing of the light emitting diode provided on the audio data reproducing apparatus and the readout timing of the CCD line sensor.

When fed with a detection output of the synchronization data, the LED driving circuit 16 drives the light emitting diodes 2L, 2R for pulses lighting so that the light emitting diodes are lighted (turned on) only during a mid time interval of 10 μsec of the total time period of 50 μsec during which the data lines are passed before the CCD line sensors 5L, 5R, as shown in FIG. 8a. This causes the playback light of the respective audio data to be radiated on the CCD line sensors 5L, 5R only during the mid time interval of 10 μsec.

On the other hand, the CCD driving circuit 14, when fed with the detection output of the synchronization data, transmits a readout pulse to the CCD line sensors 5L, 5R at a timing directly after the light emitting diodes 2L, 2R are driven for pulsed lighting, as shown in FIG. 8b.

Thus it becomes possible to extract only the mid-portion of the dot image of the respective audio data (the imaging signal formed during the 10 μsec period) in synchronism with the data lines, as shown in FIG. 8c, in order to reproduce and output correct audio data.

Such high-speed driving for pulsed lighting is enabled by employing the above light emitting diodes 2L, 2R as the light sources. Thus it becomes possible to provide the CCD line sensors 5L, 5R not having the electronic shutter function. That is, the charge accumulation time of the CCD line sensors 5L, 5R can be adjusted by intermittent driving of the light emitting diodes 2L, 2R for pulsed lighting, thus rendering it possible to improve the error rate by preventing the noise from being superimposed on reproduced audio data by fluctuations in the charge drain quantity such as are produced when employing the electronic shutter function.

Figure 7:
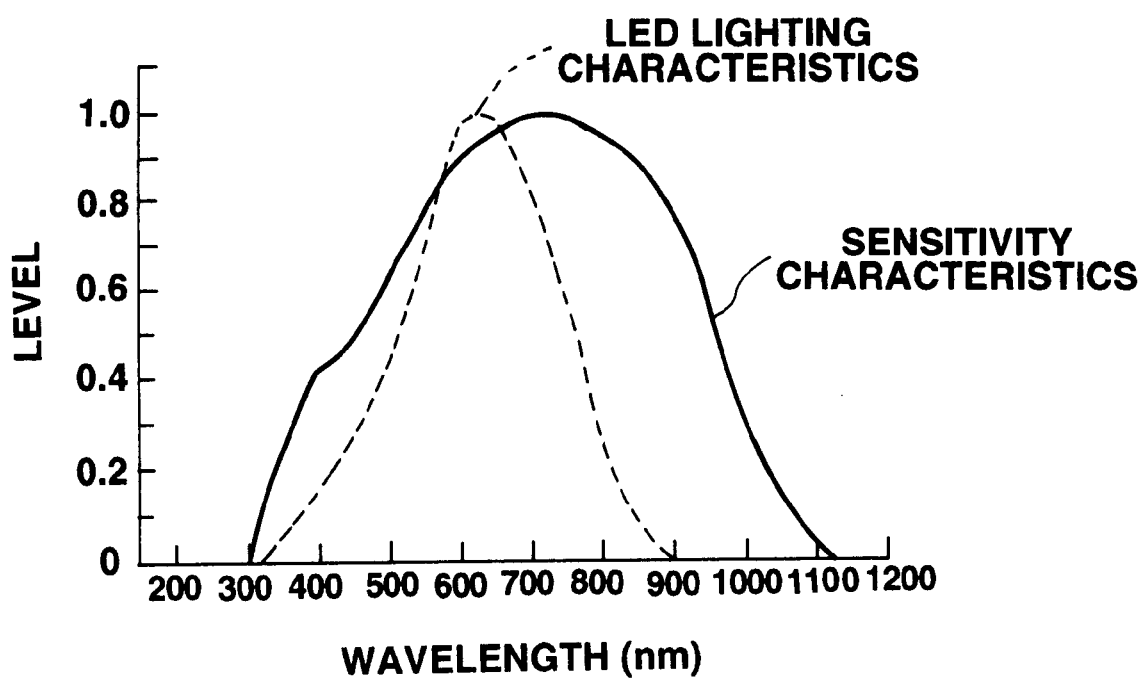
FIG. 7 is a graph for illustrating light emitting characteristics of a red-hued light emitting diode provided in the audio data reproducing apparatus and light receiving characteristics of a CCD line sensor.

Each of the CCD line sensors 5L, 5R exhibits high sensitivity of the light having the wavelength of 600 to 800 nm, as shown by a solid line in FIG. 7. On the other hand, the red-hued light radiated from the light emitting diodes 2L, 2R exhibits high sensitivity at a wavelength of 600 nm, as indicated by a broken line in FIG. 7. Thus the CCD line sensors 5L, 5R are able to radiate the playback light of high sensitivity. Although the light emitting diode has a smaller light volume than the halogen lamp, the CCD line sensors are able to radiate the light of high sensitivity through the use of the red-hued light emitting diodes.

Thus the audio data can be reproduced without regard to the light volume and the power consumption may be lower than when employing the halogen lamp. On the other hand, since the light emitting diode is small-sized and scarcely evolves heat, there is no necessity of providing heat dissipating means, so that the reproducing apparatus may be reduced in size and in production cost.

In addition, the light emitting diode has long service life and is not in need of maintenance or management thus enabling improved operating reliability of the apparatus.

The ID codes indicating the names of the film manufacturers or the like and the audio data, which are recorded in superposition on the respective digital sound tracks 20R, 20L, are recorded in red and blue hues, respectively. Consequently, by radiating the red-hued light on the motion picture film from the light emitting diodes 2L, 2R, the playback light for the ID code cannot be sensed by the CCD line sensors 5L, 5R. On the other hand, the playback light for the audio data can be radiated as the black-hued playback light on the CCD line sensors 5L, 5R. Consequently, despite the fact that the ID code and the audio data are recorded in superposition on the digital sound tracks 20R, 20L, the audio data can be exclusively reproduced without being affected by the ID codes.

Although the CCD line sensors 5L, 5R not having the electronic shutter function are employed in the above-described embodiment, the same effect may be achieved by providing the CCD line sensors having the electronic shutter function and by not activating the electronic shutter function during reproduction.

Although the respective data is 24.1 μm in transverse size, the data dot size may naturally be changed if it is on the order of 24 μm, such as 23.9 μm, 24.0 μm or 24.2 μm.

With the above-described audio data reproducing apparatus for a motion picture film, since each line of the audio data for the respective channels on the digital sound tracks 20R, 20L on the motion picture film 1 is passed through a region in front of the CCD line sensors 5L, 5R within 50 μsec, each line audio data needs to be read by the CD line sensors 51 5R within the light receiving time not longer than 50 μsec. In the present embodiment, the light receiving time is set so as to be equal to 10 μsec by driving the light emitting diodes 2L and 2R for pulsed lighting. Consequently, a larger light volume is necessitated in order to produce an output with a high S/N ratio by the CCD line sensors 5L and 5R. If such sufficient light volume cannot be produced by the light emitting diodes 2L and 2R, plural light emitting diodes may be employed for producing the sufficient light volume, as in the case of the light source shown in FIG. 14.

Figure 14:
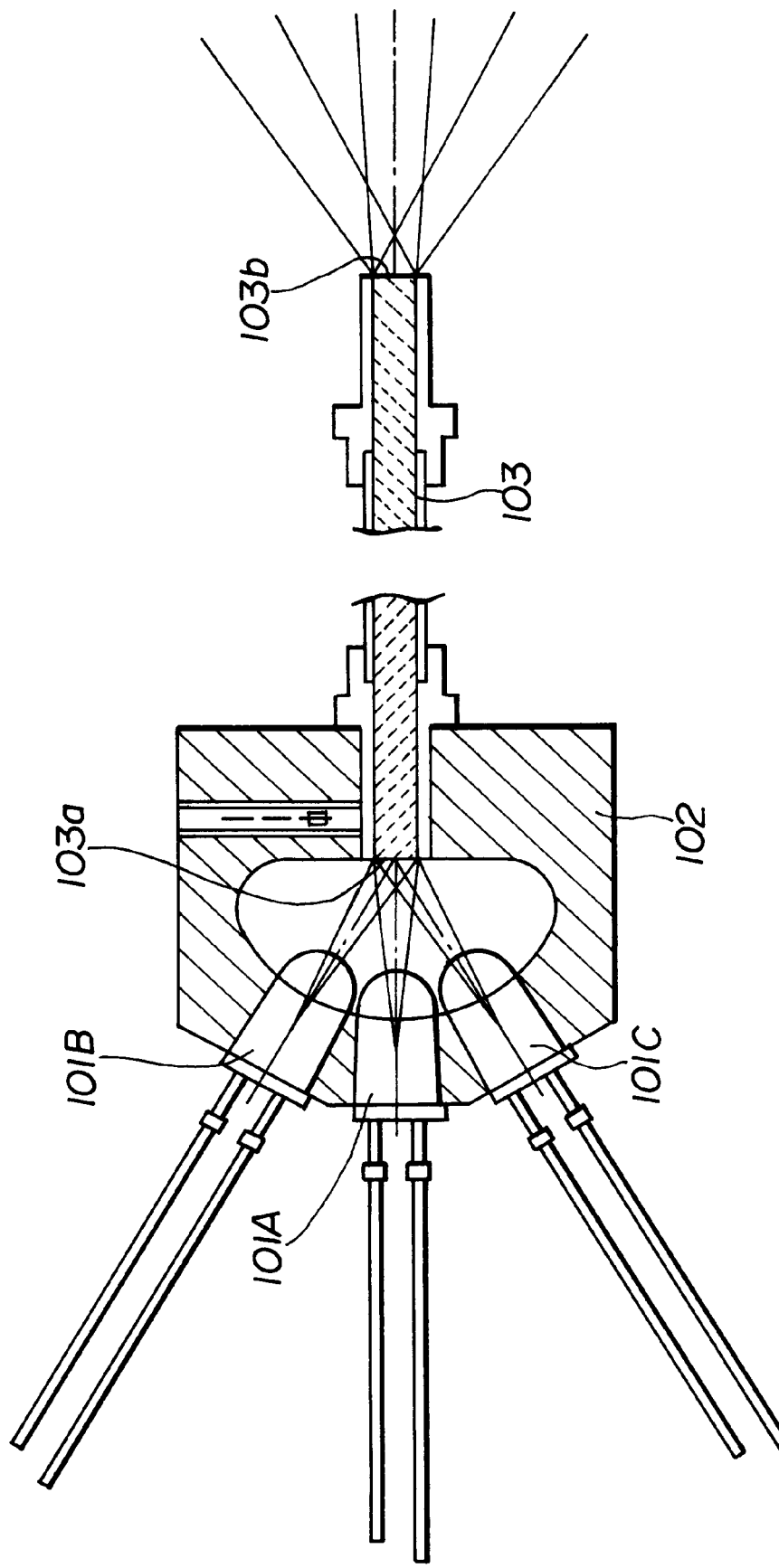
FIG. 14 is a schematic longitudinal cross-sectional view showing the construction of a light source to be used in substitution for the light emitting diode in the audio data reproducing apparatus.

The light source shown in FIG. 14 includes three light emitting diodes 101A, 101B and 101C and an optical fiber 103 on a light input 103a of which the light emitting diodes are mounted via a holder 102.

The three light emitting diodes 101A, 101B and 101C are held by the holder 102 so that the first light emitting diode 101A radiates the readout light to the light input 103a along the optical axis of the optical fiber 103 and the second and third light emitting diodes 101B and 101C radiate the readout light to the light input 103a from oblique directions intersecting the optical axis of the optical fiber 103.

With the above-described light source, the optical fiber 103 guides the readout light incident from the three light emitting diodes 101A, 101B and 101C on the light input 103a to a light output 103b, so that the readout light is radiated via the light output 103b on the digital sound track of the motion picture film, that is the information recording medium.

The readout light incident on the light input 103a from the first light emitting diode 101A along the optical axis of the optical fiber 103 is radiated from the light output 103b along the optical axis of the optical fiber 103. The readout light incident on the light input 103a from the second and third light emitting diodes 101B and 101C from oblique directions intersecting the optical axis of the optical fiber 103 is radiated from the light output 103b in the oblique directions intersecting the optical axis of the optical fiber 103.

Thus the readout light having a certain spreading extent may be radiated from the light output 103b of the optical fiber 103 onto the digital sound track of the motion picture film.

For radiating the readout light having certain spreading extent from the light output 103b of the optical fiber 103 on the digital sound track of the motion picture film, it suffices to provide at least two light emitting diodes for radiating the readout light to the light input 103a of the optical fiber 103 from the direction along the optical axis and from an oblique direction with respect to the optical axis.

By radiating the readout light having a certain spreading extent from the light output 103b of the light fiber 103 to the digital sound track of the motion picture film for reading audio data by the CCD line sensor, it becomes possible to reduce adverse effects of scratches or contaminations on the film by random reflection at the scratches or contaminations for reducing the readout error.

The light contributing to the readout output by the CCD line sensor is the readout light radiated from the light output 103b of the optical fiber 103 along the optical axis, or the readout light incident on the light input 103a by the first light emitting diode 101A from the direction along the optical axis of the optical fiber 103.

Figure 15:
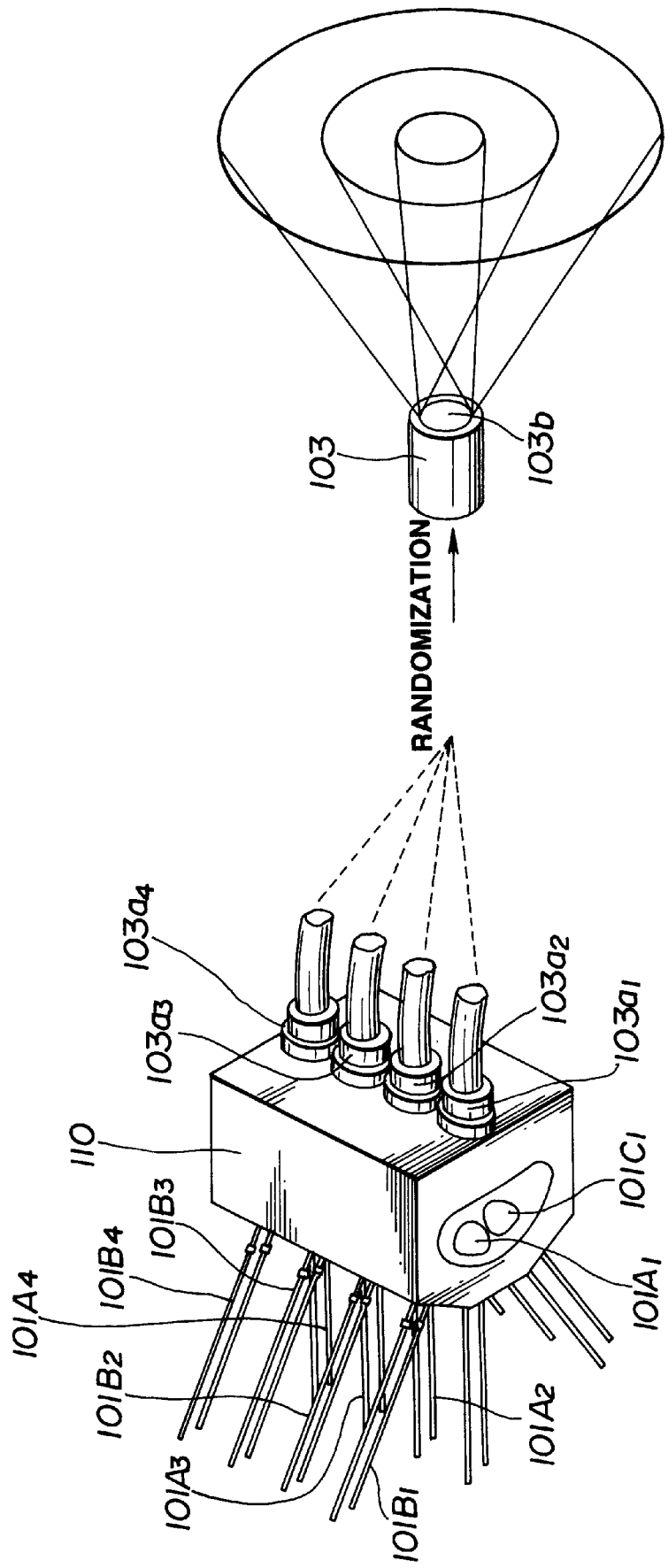
FIG. 15 is a schematic perspective view showing the construction of a light source for reading out optical data according to the present invention.

Thus, with the light source for reading out optical data according to the present invention, the light input 103a of the optical fiber 103 is branched into e.g., four light input sections $103a_1$ to $103a_4$ and first light emitting diodes $101A_1$ to $101A_4$ and second and third light emitting diodes $101B_1$ to $101B_4$ and $101C_1$ to $101C_4$ are attached via a holder 110 to the light input sections $103a_1$ to $103a_4$ for increasing the amount of the readout light radiated from the light output 103b of the optical fiber 103 along the optical axis, as shown in FIG. 15.

The optical fiber 103 is a bundle of, for example, 8000 individual optical fibers, from which four groups each having 2000 individual optical fibers are branched at the light input 103a. The optical fiber 103 has its four groups of the individual optical fibers interchanged in a random manner as the optical fiber 103 reaches the light output 103b.

With the above-described light source, the readout light is incident on the four light input sections $103a_1$ to $103a_4$ of the optical fiber 103 from the first light emitting diodes $101A_1$ to $101A_4$ and the second and third light emitting diodes $101B_1$ to $101B_4$ and $101C_1$ to $101C_4$ so that the readout light with a sufficient amount of light and a certain spreading extent may be radiated from the light output 103b of the optical fiber 103 to the digital sound track of the motion picture film. This permits reduction in the readout error caused by scratches or contaminations on the motion picture film.

By interchanging the groups of the individual optical fibers in a random manner between the four light input sections $103a_1$ to $103a_4$ and the light output 103b of the optical fiber 103, the readout light with the uniform light volume and the spreading extent may be radiated from the light output 103b to the digital sound track of the motion picture film. By uniforming the light volume of the readout light radiated with the spreading extent from the light output 103b, the stable readout light may be produced by the CCD line sensors.

Meanwhile, by changing the current supplied to the first light emitting diodes $101A_1$ to $101A_4$ and second and third light emitting diodes $101B_1$ to $101B_4$ and $101C_1$ to $101C_4$ for adjusting the respective light intensities, it becomes possible to further uniform the volume of the readout light radiated from the light output 103b with certain spreading extent.

What is claimed is:

1. An apparatus for reading optical data recorded as digital data from a motion picture film including at least one digital sound track extending along a film running direction having a recording area with lines extending in a direction normal to the film running direction and columns extending in the film running direction, comprising:

a light emitting diode for emitting a readout light radiated on said motion picture film;

light emission controlling means for driving said light emitting diode by pulsed lighting at a pre-set timing in a controlled manner;

a CCD line sensor for receiving the readout light radiated by said light emitting diode to said motion picture film, said CCD line sensor reproducing the readout light to digital data by photo-electric conversion and outputting the reproduced digital data; and wherein, said pulsed lighting of said light emission controlling means operates as a shutter such that said CCD line sensor does not require an electronic shutter which discharges the CCD sensor.

2. The apparatus as claimed in claim 1 wherein audio data digitized from speech information is read out and reproduced by said CCD line sensor from a digital sound track on the motion picture film having said audio data recorded thereon.

3. The apparatus as claimed in claim 2 wherein said light emitting diode radiates red-hued light on said digital sound track.

* * * * *

UNITED STATES PATENT AND TRADEMARK OFFICE
CERTIFICATE OF CORRECTION

PATENT NO.   : 6,028,972
DATED        : Feb. 22, 2000
INVENTOR(S)  : Inatome et al.

It is certified that error appears in the above-identified patent and that said Letters Patent is hereby corrected as shown below:

On the title page,
Under        Related U.S. Application Data

Item [63]    Change "08/386,767" to --08/386,167--

Signed and Sealed this

Twenty-third Day of January, 2001

Attest:

Q. TODD DICKINSON

*Attesting Officer*            *Commissioner of Patents and Trademarks*